United States Patent
Leinkram

[15] 3,680,196

[45] Aug. 1, 1972

[54] PROCESS FOR BONDING CHIP DEVICES TO HYBRID CIRCUITRY

[72] Inventor: Charles Z. Leinkram, Bowie, Md.

[73] Assignee: The United States of America as represented by the Secretary of the Navy

[22] Filed: May 8, 1970

[21] Appl. No.: 35,755

[52] U.S. Cl. .....................29/473.1, 29/502, 29/590, 117/114, 29/503

[51] Int. Cl. .............................................B23k 31/02

[58] Field of Search..........29/472.7, 473.1, 590, 589, 29/502, 503; 117/114, 51, 227

[56] References Cited

UNITED STATES PATENTS

| | | | |
|---|---|---|---|
| 3,579,816 | 12/1968 | Ingraham | 29/503 X |
| 3,071,854 | 1/1963 | Pighini | 29/473.1 |
| 3,093,882 | 6/1963 | Erneis | 29/590 |
| 3,200,490 | 8/1965 | Clymer | 29/590 X |
| 3,298,093 | 1/1967 | Cohen | 29/590 X |
| 3,316,628 | 5/1967 | Lang, Jr. | 29/472.7 |
| 3,461,462 | 8/1969 | Ruggiero | 29/590 X |
| 3,066,406 | 12/1962 | White | 29/502 X |
| 3,593,412 | 7/1971 | Foote | 29/589 X |

FOREIGN PATENTS OR APPLICATIONS

| | | | |
|---|---|---|---|
| 671,383 | 10/1963 | Canada | 29/502 |

OTHER PUBLICATIONS

Soldering Aluminum, Reynolds Metals Company, 1959, p. 12.

*Primary Examiner*—John F. Campbell
*Assistant Examiner*—Ronald J. Shore
*Attorney*—R. S. Sciascia, Arthur L. Branning and John M. Neary

[57] ABSTRACT

A process for bonding chip devices to hybrid circuitry including the steps of: 1) prewetting the chips by scrubbing in a gold-silicon solder lake at 400° C, 2) heating the substrate to eutectic temperature of 377° C, 3) positioning the chips on the gold land of the substrate, 4) pushing the chips onto the substrate to overcome the surface tension and cause the solder to flow, completely wetting the chip and substrate.

3 Claims, 4 Drawing Figures

PATENTED AUG 1 1972 3,680,196

INVENTOR
CHARLES Z. LEINKRAM

BY AGENT

ATTORNEY

PROCESS FOR BONDING CHIP DEVICES TO HYBRID CIRCUITRY

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

This invention relates generally to a process for achieving an electrically conductive adhesion between two non-metallic bodies, and more particularly, to a process for mounting silicon active devices such as transistors, diodes and integrated circuits into a gold land area deposited on an alumina substrate.

The technique for forming hybrid micro-electronic systems starts with a small one inch square alumina ceramic tile approximately 1/16 inch thick. On this square a film of gold of approximately 5000 Angstroms is deposited. The gold is then selectively removed leaving a circuit of gold lands interconnected by gold conductors. It is then necessary to bond the electrical elements such as transistors, diodes and the tiny integrated circuits onto these gold lands.

One technique for bonding the silicon chips to the gold land area has been to mechanically scrub the chip against the gold layer at a temperature in excess of the gold-silicon eutectic temperature of 370° C. This technique has not found wide acceptance because 1) the bond achieved has not been reliable, and 2) because of the extreme miniaturization of the gold land area it frequencly occured that manual scrubbing would smear the gold land onto adjacent gold conductors, causing shorts and failure of the device.

Another technique, known as flip-chip bonding, includes the steps of securing a plurality of spacers or pillars on the top surface of the chip, coating the the spacers with a lead-tin solder, reversing (or flipping) the chip so that the top surface is now on the bottom, placing the chip on the substrate, and heating the chip and/or the substrate to reflow the solder. This technique has several disadvantages. First, the point contacts between the chip device and the substrate are invariably weak and subject to failure under vibration or other stress. More importantly, it has been found that reliable bonds between the silicon and the alumina substrate are very difficult if not impossible to form with a lead-tin solder. The gold land areas deposited on the alumina substrate tend to be absorbed by the solder leaving only the alumina surface which is not wet by the solder.

To eliminate this problem it has been proposed to delete the heating step and supply the energy needed to raise the temperature of the solder to the eutectic by ultrasonic scrubbing This was first thought to have great promise, but has not performed as well as expected. The bonds produced by this technique have not proven reliable or reproducible partly because the ultrasonic bonding tip has a mass much greater than that of the chips and consequently acts as a massive heat sink, thereby preventing the attainment of eutectic temperature at the chip-substrate interface. The ultrasonic pulse merely produces a mechanical abrading of the gold layer and yet another reject. It is clear that for a economically usable, system the technique must produce bonds on a reliable and reproducible basis to minimize the occurrence of rejects due to bond failure.

A further problem with this technique is the low thermal conductivity afforded by the small contact areas between the chip spacers and the substrate. In power devices it is necessary to dissipate heat generated in the electrical components to prevent an increase in their temperature to the point where they would suffer a degradation is performance. Small contact areas with the substrate preclude any significant heat conduction through the substrate, leaving only the shower modes of convection and radiation. This has been a persistant cause of failure in many power application situations.

There has therefore long existed a need in the art for a technique for process for bonding chip devices to the gold land area of a hybrid micro-electronic substrate which produces a reliable, electrically conductive, thermally conductive and reproduceable bond between the chip and the substrate.

SUMMARY OF THE INVENTION

Accordingly, one object of this invention is to provide a process for securing a silicon active device to an alumina substrate.

Another object of this invention is to provide a process for mounting silicon active devices with a strong mechanical bond to an alumina substrate.

Still another object of the present invention is to provide a process for mounting a silicon chip to an alumina substrate which produces a strong mechanical bond, a low resistance electrical bond, and a highly conductive thermal bond.

A further object of the instant invention is to provide a process for mounting chip devices to an alumina substrate which achieves excellent reliability and reproduceability and is amenable to high volume production.

Briefly, these and other objects are attained by pretinning the chip in a gold silicon-eutectic at 400° C, heating the substrate to 377° C, positioning the pretinned chip on the gold land area with fine tweezers, and pushing the chip onto the gold land area to break the eutectic surface tension.

DESCRIPTION OF THE DRAWINGS

A more complete appreciation of the invention and its many attendant advantages will develop as the same becomes better understood by reference to the following detailed description when considered in connection with the accompanying drawings, wherein.

Figure 1:
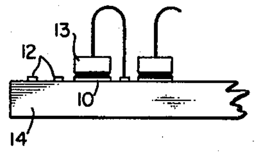
FIG. 1 is an elevation in section of a hybrid microelectronic system onto which the chips are mounted.

Referring now to the drawings wherein like reference characters designate identical or corresponding parts throughout the several views. And more particularly to FIG. 1 thereof wherein a portion of a hybrid microelectronic system is shown, greatly enlarged. Gold land areas 10 are deposited on an alumina substrate 14 and the circuit is completed by tiny interconnecting gold conductors 12. To complete the hybrid micro-electronic system the electrical elements 13 such as resistors, transistors, diodes and tiny integrated circuits must be bonded to gold land areas 10. The outside dimensions of the substrate 14 is one inch square, so it can be seen that the gold land areas in which the silicon devices must be bonded are extremely small and great care must be taken to avoid forming unwanted conducting bridges between the gold land area 10 and adjacent conductors 12.

Figure 2A:
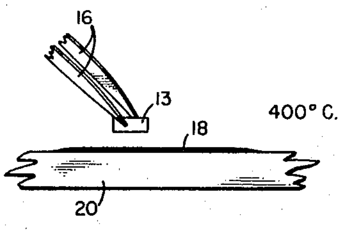
FIG. 2 is a schematic flow chart of the process of the present invention.
Figure 2B:
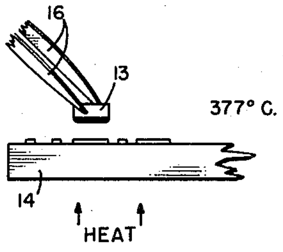
Figure 2C:
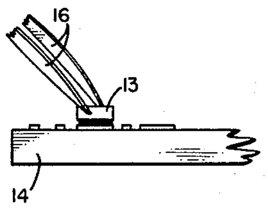

Looking at FIG. 2, the silicon chip is handled with a gripping device of low thermal conduction such as a pair of fine tweezers 16 during all stages of assembly process. The fine tweezers are used to allow the chip to quickly attain thermal equilibrium with the several environments along the stages of the process, thus saving the chip from prolonged heating which would occur if relatively massive metallic handling devices were used which would act as heat sinks and require the transmission of relatively great quantities of heat through the silicon chip, or otherwise slow the attainment of thermal equilibrium.

A solder lake 18 consisting of 98 percent gold and 2 percent silicon is formed on an unglazed alumina substrate 20. The silicon chip, handled by fine tweezers 16, is scrubbed in the solder lake at 400° C without the necessity for an inert gas shield. The total time required to pre-solder a chip averages seven seconds. The chip is then ready for mounting on the gold land 10 of alumina substrate 14 which could be done immediately or the chip could be stored for an indefinite period with the gold-silicon solder coating suffering no degradation during the storage period.

The pre-tinned chip is then positioned on the proper gold land 10 of the substrate 14 which had been heated to approximately 377° C. It is then necessary merely to give a slight downward push on the chip with the tweezers to break the surface tension of the solder and cause the solder to flow onto the gold land area thus producing a complete bond over the entire surface area of the chip and the gold land area. The lower temperature of 377° C is used to limit as far as possible the thermal degradation of the chip which, during the assembly of the hybrid circuit, must be exposed to the assembly temperature for some time. The higher temperature of 400° C is used for prewetting the chip because the critical wet chip-solder interface is achieved much more readily at this temperature and the period the chip is exposed to that temperature is so short that no damage is incured.

The use of this technique results in the critical chip solder interface being completely wet by and bonded to the solder. By diffusion of the chip silicon into the solder during prewetting a eutectic composition 15 probably approached which melts instantly when the chip is placed on the heated substrate. The slight downward push of the tweezers merely overcomes the surface tension of the melted solder and cause it to flow onto the land area.

To reduce the amount of gold silicon solder available for migration along the etched lands of the substrate and to allow the chip to sit flush with the substrate so that subsequent wire bonding can easily be accomplished, it was found that wiping away excess solder from the underside of the chip by rubbing the chip against a non-wet gold area as the last step of the prewetting operation is effective to remove the excess solder while leaving good gold-silicon interface at the underside of the chip.

The bond achieved by this process produces an excellent mechanical adhesion capable of resisting a shear force of over 500 grams. The bond was so strong, in fact, that in all tests the chip device shattered before the bond parted. The electrical connection between the chip and the gold land area obviously approaches the ideal. Another advantage achieved by this process is an excellent thermal bond between the chip and the substrate. In power devices it is frequently necessary to dissipate a certain amount of heat from the chip or integrated circuit device. The flip-chip process or point contact process provides for contact between the chip and the substrate at only tiny point locations and therefore severly limits the thermal conductivity between the chip and the substrate. The present invention provides a thermal path between the broad face of the device and the substrate and allows ready attainment of thermal equilibrium between the chip and the substrate and thereby absolutely precludes overheating of the chip during electrical operation of the circuit.

The present process and some of the experimental procedures involved in its development is explained in detail in the Apr. 1969 report of NRL progress at page 35.

Obviously numerous modifications and variations of the present invention are possible. It is therefore to be understood that within the scope of the appended claims the invention may be practiced otherwise than as specifically described herein.

What is claimed and desired to be secured by Letters Patent of the United States is:

1. A process for bonding a in a solder lake formed chip to a gold land on a substrate, comprising:
- scrubbing said chip of molten gold-silicon eutectic at a temperature of approximately 400° C to coat said chip with gold-silicon eutectic,
- heating said substrate to a temperature in excess of the eutectic but less than 400° C,
- positioning said coated chip on the gold land of said substrate and;
- pushing said coated chip onto said gold land area to overcome the surface tension and cause the gold-silicon eutectic to flow and form a bond over the entire surface of said coated chip and the gold land area.

2. The process defined in claim 1, wherein:
said substrate is heated to substantially 377° C.

3. The process defined in claim 1, wherein:
said scrubbing, positioning and pushing steps comprise gripping said coated chip with a gripping device of low thermal conduction to minimize heat transfer from said coated chip to said gripping device and facilitate rapid attainment by said coated chip of said thermal equilbrium with said solder lake and said gold land respectively.

* * * * *

UNITED STATES PATENT OFFICE
CERTIFICATE OF CORRECTION

Patent No. 3,680,196 Dated 1 August 1972

Inventor(s) Charles Z. Leinkram

It is certified that error appears in the above-identified patent and that said Letters Patent are hereby corrected as shown below:

Claim 1 should read as follows:

1. A process for bonding a silicon chip to a gold land on a substrate, comprising:

scrubbing said chip in a solder lake formed of molten gold-silicon eutectic at a temperature of approximately 400°C to coat said chip with gold-silicon eutectic, heating said substrate to a temperature in excess of the eutectic but less than 400°C, positioning said coated chip on the gold land of said substrate and;

pushing said coated chip onto said gold land area to overcome the surface tension and cause the gold-silicon eutectic to flow and form a bond over the entire surface of said coated chip and the gold land area.

Signed and sealed this 30th day of January 1973.

(SEAL)
Attest:

EDWARD M.FLETCHER,JR.
Attesting Officer

ROBERT GOTTSCHALK
Commissioner of Patents

FORM PO-1050 (10-69)

USCOMM-DC 60376-P69
☆ U.S. GOVERNMENT PRINTING OFFICE 1969 O--366-334